United States Patent [19]

Mosely et al.

[11] Patent Number: 6,071,572
[45] Date of Patent: Jun. 6, 2000

[54] FORMING TIN THIN FILMS USING REMOTE ACTIVATED SPECIE GENERATION

[75] Inventors: Roderick C. Mosely, Pleasanton; Jim Van Gogh, Sunnyvale; Karl A. Littau, Palo Alto, all of Calif.

[73] Assignee: Applied Materials, Inc., Santa Clara, Calif.

[21] Appl. No.: 08/731,333

[22] Filed: Oct. 15, 1996

[51] Int. Cl.[7] .................................................. C23C 16/00
[52] U.S. Cl. .................................... 427/570; 118/723 ER; 118/723 IR; 118/723 MP; 427/573; 427/590
[58] Field of Search ............................ 118/719, 723 MP, 118/723 ER, 723 IR, 723 ME; 427/570, 573, 575, 590

[56] References Cited

U.S. PATENT DOCUMENTS

| Re. 35,785 | 5/1998 | Sandhu ..................................... 438/681 |
| 4,282,267 | 8/1981 | Küyel . |
| 4,428,812 | 1/1984 | Sproul ................................. 204/192 R |
| 4,786,566 | 11/1988 | Siemers ................................... 428/568 |
| 4,818,326 | 4/1989 | Liu et al. . |
| 4,916,089 | 4/1990 | Van Suchtelen ........................... 437/81 |
| 5,232,871 | 8/1993 | Ho . |
| 5,273,783 | 12/1993 | Wanner . |
| 5,711,811 | 1/1998 | Suntola ................................... 118/711 |

FOREIGN PATENT DOCUMENTS

| 0 042 574 | 12/1981 | European Pat. Off. . |
| 0042574 | 12/1981 | European Pat. Off. . |
| 0 387 456 | 9/1990 | European Pat. Off. . |
| 95/33866 | 12/1995 | WIPO . |

OTHER PUBLICATIONS

Dixit, et al., "Reactively sputtered titanium nitride films for submicron contact barrier metalization," *Appl. Phys. Lett.* 62 (4), 357–359 (Jan. 25, 1993).

Kheyrandish, et al., "Effect of deposition parameters on the microstructure of ion beam assited deposition Tin films," *J. Vac. Sci. Technol.* A, vol. 12. No. 5:2723–2727 (Oct., 1994).

Intemann, et al., "Film Properties of CVD Titanium Nitride Deposited with Organometallic Precursors at Low Pressure . . . ", J. Electrochem. Soc., vol. 140, No. 11: 3215–3222 (Nov. 1993).

Satoshi Tanimoto et al., "Synchronously Excited Discrete Chemical Vapor Deposition of $Ta_2O_5$", Journal of the Electrochemical Society, vol. 141, No. 5, May 1, 1994, pp. 1339–1346.

Y.H. Chang et al., "Enhancement of Titanium Nitride Barrier Metal Properties by Nitrogen Radical Assisted Metalorganic Chemical Vapor Deposition", Appl. Phys. Lett., vol. 68, No. 18, Apr. 29, 1996, p. 2580–2582.

Kenji Hiramatsu et al., "Formation of Tin Films with Low CL Concentration by Pulsed Plasma Chemical Vapor Deposition", Journal of Vaccuum Science and Technology, Part A, vol. 14, No. 3, May 1996, pp. 1037–1040.

*Primary Examiner*—Richard Bueker
*Assistant Examiner*—Erin Fieler
*Attorney, Agent, or Firm*—Fish & Richardson

[57] ABSTRACT

In a vapor deposition chamber which holds a substrate for processing, a method including the steps of forming a layer of material on the surface of the substrate, wherein the layer of material is made of Ti atoms; remotely activating a source gas containing nitrogen so as to produce activated nitrogen gas species; and while forming the layer of material on the substrate, injecting the activated nitrogen species into the processing chamber to increase the population of activated nitrogen species that is incorporated into the layer of material that is being formed.

29 Claims, 1 Drawing Sheet

FORMING TIN THIN FILMS USING REMOTE ACTIVATED SPECIE GENERATION

BACKGROUND OF THE INVENTION

The invention relates generally to physical vapor deposition (PVD) and chemical vapor deposition (CVD) TiN processes such as are used in the fabrication of semiconductor devices.

Titanium nitride (TiN) is used in the manufacture of semiconductor devices, particularly as a barrier layer between a semiconductor substrate and a conductive layer which forms an electrical contact. The TiN barrier prevents interdiffusion of dissimilar materials, such as silicon and aluminum. It also is a good chemical barrier to gas phase species, such as tungsten hexaflouride, used in tungsten deposition processes.

Various process techniques, including both PVD and CVD, are used to produce TiN barrier layers. In the case of PVD, one might typically use a plasma to sputter a titanium target in a nitrogen atmosphere. The sputtered titanium atoms combine with plasma excited nitrogen gas species molecules to form TiN on the surface of the substrate. Subsequent to depositing the TiN layer, a heating step is then used to produce a titanium silicide at the interface between the TiN layer and the silicon substrate to thereby form an ohmic contact. In the case of CVD, a metallo-organic titanium compound (i.e., a precursor) is used to form the TiN film. The precursor readily decomposes at relatively low temperatures to deposit a TiN film on the surface of the substrate. The CVD method typically yields good deposition rates and excellent conformality and step coverage as compared to the PVD methods.

In general, however, regardless of the technique that is used, the quality of the CVD TiN film often leaves room for improvement. For example, it has been difficult to obtain TiN films that have sufficiently good electrical and physical characteristics. Often the resistivities of the CVD TiN films are not as low as desired. Thus, the process window for producing the film becomes is very small and the deposited films are very sensitive to small changes in process parameters. In addition, the CVD TiN films often tend to be unstable and their resistivity increases over time to such an extent that they are unusable as ohmic contacts.

Thus, further improvements in the techniques for producing high quality, stabile TiN films are still needed.

SUMMARY OF THE INVENTION

In accordance with one aspect of the invention, a TiN film deposition system (either PVD or CVD) is modified by adding a remote source of excited $N_2^+$ gas species. Thus, the nitrogen gas species is excited externally and introduced it into the chamber where it interacts with the Ti or TiN film that is deposited.

In general, in one aspect, the invention is a method of using a vapor deposition chamber which holds a substrate for processing. The method includes the steps of forming a layer of material on the surface of the substrate, the layer of material including Ti atoms; remotely activating a source gas containing nitrogen so as to produce activated nitrogen gas species; and while forming the layer of material on the substrate, injecting the activated nitrogen species into the processing chamber to increase the population of activated nitrogen species that is incorporated into the layer of material that is being formed.

In general, in another aspect, the invention is a method of operating a physical vapor deposition chamber which holds a substrate for processing. The method includes the steps of generating a plasma in the chamber; using the plasma to deposit TiN onto the substrate; remotely activating a source gas containing nitrogen so as to produce activated nitrogen gas species; and injecting the activated nitrogen species into the plasma processing chamber to increase the population of activated nitrogen species that is incorporated into the TiN layer that is being deposited.

Preferred embodiments include the following features. The step of remotely activating a source gas involves heating the gas, or using an electrostatic discharge, or using microwave energy to produce the activated nitrogen species. The steps of injecting and depositing are performed either concurrently or they are performed sequentially and in a pulsed manner. The method also includes the step of biasing the substrate so as to achieve greater film penetration by the activated nitrogen species.

In general, in yet another aspect, the invention is a method which uses a chemical vapor deposition chamber holding a substrate for processing. The method includes the steps of remotely activating a source gas containing nitrogen to produce an activated nitrogen species; depositing, through a chemical vapor deposition technique, a layer of TiN onto the substrate; and injecting activated nitrogen species into the chamber from a remote source so as to increase the population of activated nitrogen species that is incorporated into the TiN layer that is being deposited.

Preferred embodiments include the following features. The step of injecting is performed either concurrently with the step of depositing or after and separate from the step of depositing. In the later case, the method further includes the steps of repeating the depositing and injecting steps until a deposited TiN layer having a predetermined thickness is formed. The step of remotely activating a source gas is done by heating the gas, by using an electrostatic discharge, or by using microwave energy to produce the activated nitrogen species. The method further includes the step of heating the substrate prior to the steps of depositing and injecting so that the substrate is at an elevated temperature during those steps. Also, the method includes biasing the substrate so as to achieve greater film penetration by the activated nitrogen species.

In general, in still another aspect, the invention is a chemical vapor deposition system including a chamber; a susceptor which holds a substrate that is to be processed in the chamber; a first gas injection port through which a first gas is injected into the chamber; a second gas injection port through which a second gas is injected into the chamber; a first solenoid valve which controls the flow of the first gas into the chamber through the first gas injection port; and a second solenoid valve which controls the flow of the second gas into the chamber through the second gas injection port.

In preferred embodiments, the chemical vapor deposition system further includes a controller which is programmed to operate the first and second solenoids sequentially to achieve a pulsed operation.

The addition of the remote excitation source yields considerably more control over the population density of the activated $N_2^+$ species arriving at the TiN film than is possible in conventional systems. Thus, it also provides greater control over the characteristics of the deposited film. Also, the invention yields an additional degree of freedom in controlling the formation of the TiN film. Furthermore, the use ex-situ excitation of the nitrogen gas eliminates having to rely on an in-situ excitation mechanism and in the case of the PVD TiN system it permits running the system without having to use a bias on the substrate.

With the invention, it is possible to produce at low temperatures TiN films which have electrical characteristics that are similar or superior to the TiN films that are produced at high temperatures in a conventional deposition system.

The exposure of the TiN film to the enhanced population densities of N2+ gas species that are possible with the invention changes the TiN film so that it becomes more resistant to absorption of $O_2$, i.e., it makes it a more stable chemical material. It appears that the free Ti bonds are more completely reacted with $N_2^+$, thus, when the film is later exposed to air, there will be no chemical reaction with the $O_2$ from the ambient that will cause the characteristics of the film to change.

Other advantages and features will become apparent from the following description of the preferred embodiment and from the claims.

DESCRIPTION OF THE PREFERRED EMBODIMENTS

In accordance with one aspect of the invention, a source of $N_2$ is remotely excited to form $N_2^+$ which is then injected into the process chamber to enhance the nitridation of the TIN layer that is being deposited. The remote generation of activated $N_2^+$ specie can be used in either a PVD process or a CVD process. Example of each system modified in accordance with the invention are shown below.

Figure 1:
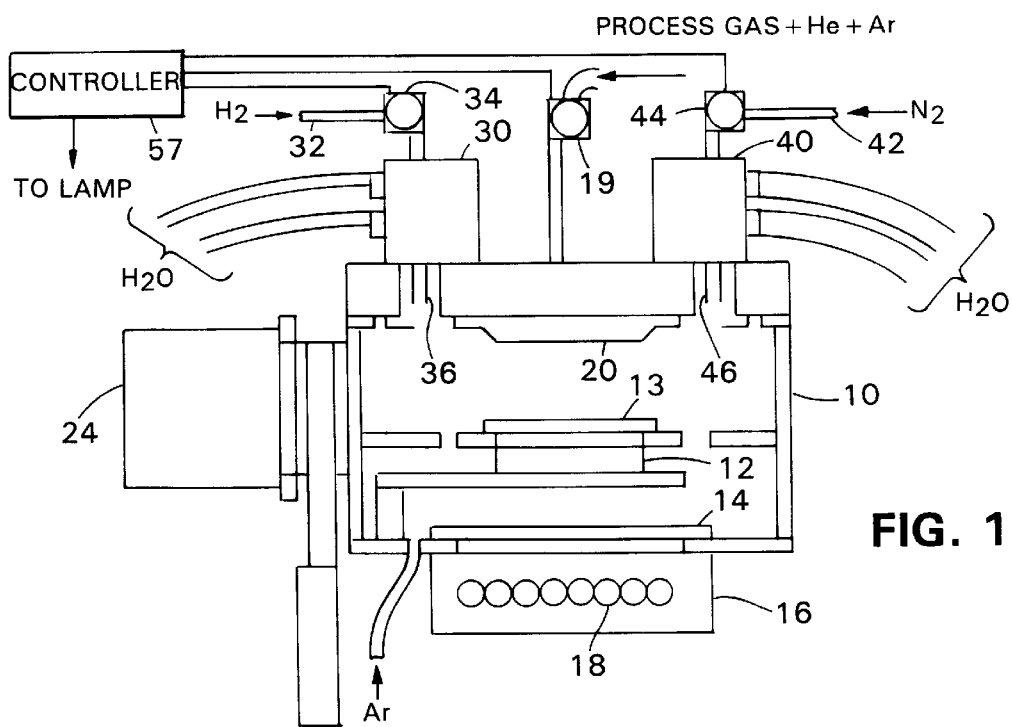
FIG. 1 is a block diagram of a CVD system modified to include a remote excitation source for generating activated $N_2^+$ species.

CVD System:

FIG. 1 shows a CVD chamber 10 which has been modified in accordance with the invention. The basic system is a CVD TiN chamber which is part of the Endura system manufactured and sold by Applied Materials, Inc. of Santa Clara, Calif. It includes an aluminum susceptor 12 which supports a substrate (e.g. a semiconductor wafer) during processing. At the bottom of chamber 10, there is a heater 16 which includes an array of heat lamps 18 that are separated from the inside of chamber 10 by a quartz window 14. Heater 16 irradiates susceptor 12 through quartz window 14 to heat susceptor 12 and thereby substrate 13 to an appropriate process temperature. Above susceptor 12 there is a showerhead 20 through which a precursor gas is introduced into chamber 10. A solenoid or piezoelectric valve 19 controls the delivery of the mixture of carrier gases (e.g. He, $N_2$ and Ar) and the precursor to the showerhead. When the precursor gas reaches the showerhead, it is dispersed by a blocker plate (not shown) and then passes out into chamber through an array of holes in the face of the showerhead. A shower of precursor gas rains down onto the heated substrate. When it hits the heated substrate, it decomposes and deposits a carbo titanium nitride ($TiN_xC_y$) metal film onto the surface of the substrate. Unreacted material is collected and removed through the vacuum system described below.

The inside walls of the chamber cooled (e.g. less than about 45–75° C.) so that the precursor gas does not react on those surfaces and deposit a TiN film.

A high efficiency vacuum pump system 24 connected to the chamber produces and maintains the required vacuum conditions in the chamber for processing. The pump system includes either a turbo pump or a cryogenic pump backed up by a mechanical roughing pump. The turbo or cryo pump is used to produce an initial, very low base pressure (e.g. $1-2\times10^{-7}$ Torr) in the chamber with no gas flowing through the chamber and prior to flowing in the processes gas to bring the chamber up to the desired operating pressure for the TiN deposition. The initial low base pressure guarantees a very low background level of $O_2$ and water vapor.

A gas purge line 26 connected to the bottom of chamber 10 supplies a purge gas (e.g. argon) to the area beneath susceptor 12. The purge gas prevents the precursor gas from reaching and depositing onto the quartz lamp window and other heated portions of the chamber.

Two water-cooled, reactive species generators 30 and 40 are mounted on top of chamber 10. Generators 30 and 40 are used to remotely excite or activate a corresponding process gas prior to its injection into chamber 10. Generator 30 receives $H_2$ through a supply line 32 that is controlled by a first pulse valve 34 and generator 40 receives $N_2$ through another supply line 42 that is controlled by a second pulse valve 44. The pulse valves may be solenoid or piezoelectric valves. Both generators 30 and 40 supply activated species into chamber 10 through injection ports 36 and 46, respectively, that are located near the outer periphery of showerhead 20. In general, the reactive species generators are remote plasma sources that are used to activate the species before it is injected into the chamber.

In the described embodiment, the reactive species generator is a plasma flame spray gun which uses high powered electrostatic discharge to excite the gas flowing through it. Alternatively, it can be any one of a number of other appropriate known devices for exciting gases remotely. For example, the generator can be implemented by a microwave plasma applicator such as are commercially available or it can be an RF plasma source or it can be a high temperature flame source, just to name a few other possibilities.

A programmed controller 57 controls and coordinates the operation of generators 30 and 40, pulse valves 19, 34, and 44 and heater 16 to achieve the operation which will now be described. A memory 61 within the controller 57 stores computer-readable instructions which cause the controller 57 to operate the system as described in the next section.

Operation:

The CVD system is operated in a pulsed manner with two phases of operation. During a first phase, the precursor gas (e.g. TDMAT—tetrabisdiaminotitanium) is injected through the showerhead to deposit onto the surface of the substrate a thin film of TiN of a predetermined thickness, e.g. 10–50 Å. Then, during a second phase the precursor gas is shut off and activated $N_2^+$ is injected into the chamber and allowed to react with the just-deposited thin layer of TiN. The activated $N_2^+$ reacts with the free Ti atoms in the layer to form a more stoichiometric material.

The sequence is repeated, first growing a thin TiN layer and then exposing it to activated $N_2^+$, until a film having the total desired thickness is deposited (e.g. 100–1000 Å, depending upon the application). Note that a standard film thickness for TiN barrier applications is typically about 100 Å. The duration of the first phase during which a thin layer of TiN is deposited is dictated by the deposition rate that is achieved in the CVD chamber. For example, if the flow rate of the precursor is selected to yield a deposition rate of about 200 Å/min, then to deposit a layer of about 10 Å will require about 3 seconds. The subsequent activation phase during which $N_2^+$ is injected above the substrate will have a comparable duration, although this can be adjusted on the basis of empirical results to yield optimum results.

Standard, well known, process conditions may be used to deposit the thin TiN film prior to the injection of $N_2^+$ activated species. Typical conditions might include heating the substrate to about 470° C. and reducing chamber pressure to about 0.7–1.0 Torr. Typically He is used as carrier gas for the precursor (e.g. tetrakisdimethylaminotitanium—TDMAT) and Ar may be used as both a process gas and purge gas.

The lamp projects energy up to the backside of the susceptor thereby heating the susceptor. To increase the thermal coupling between the susceptor and the substrate, the chamber is first pressurized (e.g. up to 5 torr) for 15 seconds during a preheat step. The increased chamber pressure improves thermal conduction from the heated susceptor to the substrate so that the substrate can be more quickly preheated up to its process temperature. When the substrate reaches the process temperature, the chamber pressure is then dropped to an appropriate level (e.g. 0.7 Torr) so that film deposition can take place. The susceptor temperature is monitored by a thermocouple and the power to the heater is controlled to maintain the desired susceptor temperature.

During the first phase of the sequential operation (i.e., the deposition phase), it is desirable to avoid depositing too thick a TiN film so that the $N_2^+$ can fully react with the deposited material without requiring some penetration enhancement mechanism such as bombardment. That is, the process is designed to enable the nitridation to take place by merely exposing the deposited film to the activated $N_2^+$ species. Without causing the $N_2^+$ species to bombard the deposited layer, its penetration depth will be on the order of one monolayer. An appropriate film thickness might be about 10 Å. On the other hand, if the film is deposited too thick (e.g. more than about 50 Å), it may be necessary to bias the substrate so as to increase the energy with which the $N_2^+$ species bombards the surface and thereby drive the $N_2^+$ species deeper into the deposited layer.

By moving the source of activated $N_2^+$ species outside of the chamber, we can control the chemistry within the chamber over a much broader range of operating and process conditions. In addition, keeping the activation step separate from the CVD step insures that we do not encumber the deposition process with complexities that make it difficult to control. That is, by separating the $N_2^+$ injection phase from the film deposition phase, we prevent the generation of activated $N_2^+$ species from interfering with the deposition process that takes place above the wafer. This also means that a wider range of process conditions will be available for conducting the deposition phase of operation than would be the case if the nitridation process were to be combined with the deposition process.

In a modified mode of operation, activated $H_2^+$ is injected into the chamber while the TiN layer is being deposited. The activated $H_2^+$ serves to strip off the carbon compounds that are also produced by the precursor gas when it decomposes. If the carbon compounds end up in the film they will tend to increase its resistivity and degrade the quality and stability of the TiN film. The injected $H_2^+$ combines with the carbon in the carbon compounds that are generated to form a volatile hydrocarbon, e.g. methane gas, that can be pumped out of the system thereby preventing it from contaminating the deposited film.

If it is deemed to be desirable to deposit more than 50 Å(e.g. 100 Å) before exposing it to $N_2^+$, then it would be appropriate to a power source (e.g. a 13.56 MHz energy source) to produce bias the pedestal/substrate and to thereby increase the energy with which the $N_2^+$ ions bombard surface of substrate. This would increase the penetration of the $N_2^+$ ions into deposited TiN layer.

Figure 2:
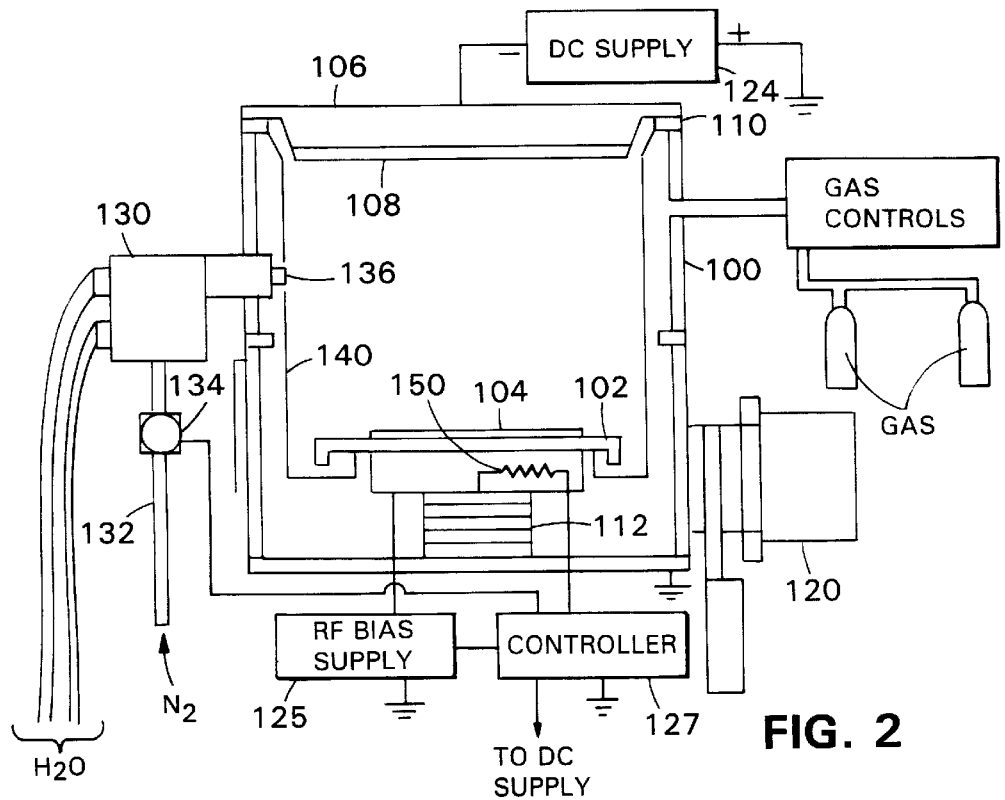
FIG. 2 is a block diagram of a PVD system modified to include a remote excitation source for generating activated $N_2^+$ species.

PVD System:

Referring to FIG. 2, a PVD chamber 100 which has been modified in accordance with the invention includes a movable lower platform 102 which holds a substrate (e.g. a semiconductor wafer) 104 during processing. Lower platform 102 can be raised and lowered by a mechanical lift mechanism 112 to facilitate loading/unloading of substrates and to appropriately position the substrate for plasma processing. At the top of the chamber there is a source assembly 106 on which a titanium sputter target 108 is mounted. In the described embodiment, source assembly 106 is a magnetron, although other source types may be used. Source assembly 106 and target 108 are electrically isolated from chamber 100 by an insulator ring 110. A metal shield 140 which surrounds the inside of chamber 100 and extends from source assembly 106 down to platform 102 shields the outer walls of the chamber from being coated with TiN during plasma processing.

Platform 102 may optionally include a heater 150 for heating the substrate to an elevated temperature during deposition.

A turbo or cryogenic vacuum pump 120 connected to chamber 100 is used to evacuate the chamber prior to sputtering to achieve a low base pressure (i.e., low background levels of $O_2$ and $H_2O$). The turbo or cryo pump is backed up by a mechanical roughing pump (not shown). Gas control circuitry 122 controls the flow of an inert process gas (e.g. Ar) into the chamber during sputtering. A DC voltage supply 124 supplies power to target 108 to initiate and sustain the plasma sputtering process. A bias supply 125 (either RF or DC) is connected to platform 102 so as to optionally produce a bias voltage on the substrate during sputtering.

Mounted in the wall of chamber 100 is a water-cooled, remote species generator 130 which generates and injects into chamber 100 an activated $N_2^+$ species that is used to nitridate the deposited TiN film. Generator 130 receives $N_2$ through a supply line 132 that is controlled by a pulse valve 134. Generator 130 supplies activated species into chamber 100 through an injection port 136. The hardware is similar to that which was described in connection with the CVD system of FIG. 1.

A programmed controller 127 controls and coordinates the operation of the heater 150, DC supply 124, solenoid 134 and RF bias supply 125 to achieve the modes of operation which will now be described. A memory 129 within the controller 127 stores computer-readable instructions which cause the controller 127 to operate the system as described in the next section.

Operation:

The remote species generator is used to enhance to $N_2^+$ species population in the chamber. In the described embodiment, we use a remote species generator which operates by increasing the temperature of the $N_2$ gas to about 1000° C. to make sure of effective generation of the activated $N_2^+$ species. The activated species injection and plasma sputtering can be performed either concurrently or sequentially (i.e., pulsed as in the case of the CVD operation). Under concurrent operation, the activated species is injected into the plasma to change the population density of the $N_2^+$ species that is incorporated into the deposited film. Alternatively, if pulsed operation is used, a thin film is first sputter deposited onto the substrate and then the activated $N_2^+$ species is injected into the chamber to react with the just-deposited layer. This sequential operation can be accomplished by modulating the power to the target as a way of turning off and on the sputter deposition. When the power to the target is reduced to halt sputtering, activated $N_2^+$ gas is then injected at that time.

Aside from the use of the remote excitation source, the other operating conditions in the chamber can be conventional. For example, a typical deposition power for TiN may be anywhere from 5–20 kW. In addition, it may also be desirable to use a substrate heater 150 to heat the substrate to produce elevated deposition temperatures that may be anywhere from room temperature up to about 500° C. The operational pressure in the chamber is anywhere in the sub-milliTorr range (e.g. $10^{-4}$ Torr) up to the 10 or more Torr.

We have observed that the TiN formation is influenced significantly by the $N_2^+$ gas species population. In a conventional plasma sputtering chamber, the actual population density of the excited $N_2^+$ species depends upon the $N_2$ partial pressure. Therefore, to achieve higher $N_2^+$ species population densities requires higher partial pressures. Even then, however, the efficiency of excited species generation is less than about 1%, so when using in situ generation of excited species in the typical plasma sputtering chamber, the population of excited $N_2^+$ will be quite low. In addition, we have also discovered that argon, which is used in the sputtering process, is preferentially excited in comparison to $N_2$. And the excited Ar species, which competes with the excited $N_2^+$ species, has a detrimental affect on TiN film quality.

By using a remote excitation source of $N_2^+$, we can avoid a lot of these problems, we can achieve much higher $N_2^+$ population densities in the chamber, and we can have much greater control over the nitridation process and the chemistry of the film formation. Also with the use of the remote species generator, we change the relative density of $N_2^+$ vs Ar. Moreover, by being able to use a substantially lower partial pressure of $N_2$ gas in the chamber, we can also produce good TiN films at lower deposition temperatures.

For TiN applications, a typical bias is in the range of 50–100 volts, e.g. 75 volts. With the injected activated species, however, there will be less of a need to use higher biases on the substrate to get the desired level of nitridation. Indeed, low bias is probably preferred. Using a lower bias will tend to avoid generating high stress flaws in the deposited TiN layer which result from high energy bombardment f the deposited film. With excited species injection from a remote source, it becomes possible to change the reactivity of the surface simply by controlling the amount of activated species that is injected.

Sequential or pulsed operation has an added advantage with regard to particle generation in the chamber. In the PVD TiN system, particle generation is a critical issue. It decreases kit life and target life performance. That is, particle generation increases the frequency at which these components must be changed and/or cleaned. It is therefore desirable to eliminate TiN formation on the target and thereby eliminate TiN particle generation from the target. By using the pulse or sequential mode of operation in the PVD system, it is possible to deposit Ti (i.e., a thin film) with the power on, followed by pulsed activation with the target power off (or significantly reduced) to react $N_2^+$ with the deposited Ti on the substrate to form TiN. Then the activated species injection can be shut off and the cycle repeated to build up the deposited layer to the desired thickness. By separating the nitridation process from the sputter deposition process in this way, this allows one to form the TiN on the wafer and yet avoid forming TiN on the target face.

As in the case of the CVD sequential mode of operation, the duration of the two phases of operation depend upon the process conditions that are chosen. The sputter deposition rate is a function of power. At normal deposition rates, the duration of the pulse would generally be on the order of seconds. For example, at about 6.5 kW a typical deposition rate will be about 1000 Å/min. To deposit a 50 Å layer will require about 2.5 seconds of deposition. That would be followed by an unbiased, reactive species pulse of a comparable duration to react the film. This time should of course can be selected based upon an empirical determination of what produces the best results. Also, it may be desirable to clear the volume of the chamber cavity prior to the deposition step. In that case, it would be appropriate to either modify the vacuum system or include a separate pumping step between the pulses.

In sequential operation, if it is desired to deposit a thicker layer during the deposition phase (e.g. 100–1000 Å), then it may be appropriate to bias the wafer in the manner well known to persons skilled in the art so as to achieve greater film penetration of the excited $N_2^+$ gas species and thus more effective nitridation of the TiN layer.

Other embodiments are within the following claims.

What is claimed is:

1. In a physical vapor deposition chamber which holds a substrate for processing, a method comprising:

generating a plasma in the chamber;

using the plasma to deposit TiN onto the substrate;

remotely activating a source gas containing nitrogen so as to produce activated nitrogen gas species; and injecting the activated nitrogen species into the plasma processing chamber to increase the population of activated nitrogen species that is incorporated into the TiN layer that is being deposited.

2. The method of claim 1 wherein the step of remotely activating a source gas comprises heating the gas to produce the activated nitrogen species.

3. The method of claim 1 wherein the step of remotely activating a source gas comprises using an electrostatic discharge to produce the activated nitrogen species.

4. The method of claim 1 wherein the step of remotely activating a source gas comprises using microwave energy to produce the activated nitrogen species.

5. The method of claim 1 wherein the steps of injecting and depositing are performed concurrently.

6. The method of claim 1 wherein the steps of injecting and depositing are performed sequentially and in a pulsed manner.

7. The method of claim 6 further comprising biasing the substrate so as to achieve greater film penetration by the activated nitrogen species.

8. In a chemical vapor deposition chamber which holds a substrate for processing, a method comprising:

remotely activating a source gas containing $N_2$ to produce an activated nitrogen species;

depositing, through a chemical vapor deposition technique, a layer of TiN onto the substrate; and injecting the activated nitrogen species into the chamber so as to increase the population of activated nitrogen species that is incorporated into the deposited TiN layer that, wherein the step of infecting is performed after and separate from the step of depositing.

9. The method of claim 8 further comprising the steps of:

repeating the depositing and injecting steps until a deposited TiN layer having a predetermined thickness is formed.

10. The method of claim 8 wherein the step of remotely activating a source gas comprises heating the gas to produce the activated nitrogen species.

11. The method of claim 8 wherein the step of remotely activating a source gas comprises using an electrostatic discharge to produce the activated nitrogen species.

12. The method of claim 8 wherein the step of remotely activating a source gas comprises using microwave energy to produce the activated nitrogen species.

13. The method of claim 8 further comprising heating the substrate prior to the steps of depositing and injecting so that the substrate is at an elevated temperature during those steps.

14. The method of claim 9 further comprising biasing the substrate so as to achieve greater film penetration by the activated nitrogen species.

15. A chemical vapor deposition system comprising:
a process chamber;
a susceptor in the process chamber which during operation holds a substrate that is to be processed;
a first gas injection port through which a first gas is injected directly into the process chamber;
a second gas injection port through which a second gas is injected directly into the process chamber;
a first pulse valve which controls the flow of the first gas into the process chamber through the first gas injection port;
a second pulse valve which controls the flow of the second gas into the process chamber through the second gas injection port; and
a remote excitation chamber connected between the first gas injection port and the first pulse valve so that the first pulse valve controls a flow of the first gas into the remote excitation chamber and then into the process chamber.

16. The chemical vapor deposition system of claim 15 further comprising a controller which is programmed to cause the first and second pulse valves to operate in a sequential pulsed mode of operation according to which the first pulse valve is opened when the second pulse valve is closed and the first pulse valve is closed when the second pulse valve is opened.

17. The chemical vapor deposition system of claim 16 wherein the controller further comprises a memory coupled to the controller, wherein said memory stores a computer-readable program comprising instructions for causing the controller to operate the first and second pulse valves to operate in the sequential pulsed operation.

18. The chemical vapor deposition system of claim 16 further comprising a source of nitrogen containing gas connected to the first pulse valve so that the first pulse valve controls the flow of nitrogen containing gas into the remote excitation chamber and a source of titanium containing gas connected to the second pulse valve so that the second pulse valve controls the flow of titanium containing gas into the process chamber.

19. The chemical vapor deposition system of claim 16 further comprising a heat lamp which heats the susceptor during operation.

20. The chemical vapor deposition system of claim 19 wherein the controller is further programmed to operate the heat lamp during processing.

21. The chemical vapor deposition system of claim 16 further comprising:
a third gas injection port through which a third gas is injected into the process chamber;
a third pulse valve which controls the flow of the third gas into the process chamber through the third gas injection port; and
a second remote excitation chamber connected between the third gas injection port and the third pulse valve so that the third pulse valve controls a flow of the third gas into the second remote excitation chamber and then into the process chamber.

22. The chemical vapor deposition system of claim 21 wherein the controller is further programmed to operate the third pulse valve in a pulsed mode of operation.

23. The chemical vapor deposition system of claim 15 wherein the first and second pulse valves are solenoids.

24. The chemical vapor deposition system of claim 22 wherein the first, second, and third pulse valves are solenoids.

25. The chemical vapor deposition system of claim 15 wherein the remote excitation chamber comprises a remote plasma source.

26. The chemical vapor deposition system of claim 25 wherein the remote excitation chamber comprises a plasma spray gun.

27. The chemical vapor deposition system of claim 25 wherein the remote excitation chamber comprises a microwave plasma applicator.

28. The chemical vapor deposition system of claim 25 wherein the remote excitation chamber comprises a high temperature flame source.

29. A physical deposition system comprising:
a process chamber which has an injection port;
a source assembly which during operation holds a sputter target;
a platform which during operation holds a substrate that is to be processed in the process chamber;
a remote activation source coupled to the process chamber through the injection port;
a pulse valve connected to the remote activation source and which controls the flow of a first gas into the remote activation source and then into the process chamber through the injection port; and
a controller which is programmed to operate the pulse valve in a pulsed mode of operation.

* * * * *